United States Patent [19]

Simmons et al.

[11] Patent Number: 5,693,148

[45] Date of Patent: Dec. 2, 1997

[54] PROCESS FOR BRUSH CLEANING

[75] Inventors: Mark A. Simmons; Wilbur C. Krusell, both of San Jose, Calif.

[73] Assignee: Ontrak Systems, Incorporated, San Jose, Calif.

[21] Appl. No.: 555,164

[22] Filed: Nov. 8, 1995

[51] Int. Cl.$^6$ .................. B08B 7/04; B08B 3/00; B08B 1/02; A47L 15/00

[52] U.S. Cl. .................. 134/18; 15/88.3; 15/302; 134/1.3; 134/29; 134/32; 134/34; 134/902

[58] Field of Search .............. 134/1.3, 6, 9, 28–32, 134/18, 34, 902; 15/302, 88.3

[56] References Cited

U.S. PATENT DOCUMENTS

| | | |
|---|---|---|
| 3,970,471 | 7/1976 | Banks et al. ................. 134/6 |
| 4,116,714 | 9/1978 | Basi ........................... 134/3 |
| 4,569,695 | 2/1986 | Yamashita et al. ........... 134/1 |
| 4,715,392 | 12/1987 | Abe et al. ................... 134/62 |
| 5,351,360 | 10/1994 | Suzuki et al. ............... 15/302 |
| 5,375,291 | 12/1994 | Tateyama et al. ........... 15/302 |
| 5,442,828 | 8/1995 | Lutz ........................... 15/88.3 |
| 5,475,889 | 12/1995 | Thrasher et al. ............. 15/88.3 |
| 5,485,644 | 1/1996 | Shinbara et al. ............. 15/21.1 |
| 5,548,505 | 8/1996 | Simmons et al. ............ 364/130 |
| 5,555,177 | 9/1996 | Simmons ..................... 364/468.28 |

*Primary Examiner*—Arlen Soderquist
*Attorney, Agent, or Firm*—Blakely, Sokoloff, Taylor & Zafman LLP

[57] ABSTRACT

A process for brush cleaning used in semiconductor wafer scrubbing systems. A process for brush cleaning that eliminates and/or reduces the load-up of brushes with contaminants. This brush cleaning process changes the pH level of a brush to repel contaminants that are on the brush. This process extends the useful life of the brush without significantly decreasing the throughput of the scrubbing system.

52 Claims, 5 Drawing Sheets

PROCESS FOR BRUSH CLEANING

BACKGROUND OF THE INVENTION

1. Field of the Invention

This invention relates to methods of cleaning a substrate, and more specifically, to a method and process for cleaning a brush in a semiconductor wafer scrubber.

2. Prior Art

In the manufacture of semiconductor devices, the surface of semiconductor wafers must be cleaned of wafer contaminants. If not removed, wafer contaminants may affect device performance characteristics and may cause device failure to occur at faster rates than usual.

Semiconductor wafer scrubbers (wafer scrubbers) are one example of systems that are used to remove contaminants from wafers. The wafer scrubbers may scrub only one side of the wafer, or may scrub both sides of the wafer. The wafer scrubbers scrub the wafer surface(s) with brushes, removing the contaminants. After a while, however, the brushes load-up with these contaminants.

The brush of the wafer scrubber (as does any material in water) builds up a charge on its surface. This charge is known as the zeta potential of the brush. The zeta potential of the brush and the zeta potential of the contaminants are opposite one another. In other words, there is a positive-to-negative zeta potential between the brush and the contaminants. Since opposite charges attract, the brush attracts the contaminants, thus causing the brush to "load-up."

When brush load-up occurs, the amount of contamination removed from the wafers decreases. In some instances, a "loaded" brush may even add to the contamination of a wafer by depositing contaminants that have been caught in the brush back onto the wafer. Prior to the present invention there were two solutions to brush load-up: high speed idle and brush replacement.

The first solution, high speed idle, is a mechanical method for cleaning the brush. In high speed idle, the brush is rotated at very high speeds while being rinsed with water, thereby causing the contaminants to become dislodged from the brush. There are, however, several disadvantages to high speed idle. One such disadvantage is that at high speeds the brush will throw water and contaminants all over the inside of the brush station. If contamination is all over the inside of the brush station, then there is a risk that a wafer in the brush station can become contaminated again. This is especially true when a wafer has already been cleaned and is being transferred out of the brush station into a drying station or storage station and water with contaminants drips from the top or sides of the brush station onto the cleaned wafer. Another disadvantage of high speed idle is that running the motors of the scrubber at high speeds cuts down the life of the motor. Replacement costs for a motor can be considerable.

An alternate solution is to use the brush as long as possible and then replace the brush. The life of the brush will vary from manufacturer to manufacturer. Some manufacturing processes can tolerate little or no contamination so a brush will not last very long. On the other hand, other manufacturing processes may have a certain amount of contamination that can be tolerated without affecting the device to a great extent. In these situations brush life is longer. In any case, changing the brushes areas considerable consumable expenditures to the process.

The down time of the scrubber to perform high speed idle or to change the brushes should also be considered. If the downtime to clean or change the brushes is extensive, then the overall throughput of the scrubber will be reduced. A decrease in throughput can also be a considerable an expense for the manufacturer.

Thus, what is needed is a method or process for cleaning the brushes in a wafer scrubber that is quick, inexpensive, and has little risk of recontaminating the wafers.

SUMMARY OF THE INVENTION

The present invention describes a method for cleaning contaminants from a brush wherein the pH level of the brush is raised. Raising the pH level of the brush causes the contaminates to be repelled from the brush, thus reducing and/or eliminating brush load-up.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures.

DETAILED DESCRIPTION

A method and process for brush cleaning is disclosed. In the following description, numerous specific details are set forth such as specific materials, processes, parameters, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention may be employed in a number of substrate cleaning procedures. Although the present invention is described in conjunction with the semiconductor wafer scrubbers for a wafer or substrate, it will be appreciated that any similar brush scrubbing system may benefit from the method and process of the present invention. Further, it will be appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) devices, or substrates for processing other apparatus and devices such as flat panel displays, multichip modules, etc. However, to avoid obscuring the present invention the following description will describe cleaning a wafer of contaminants using a wafer scrubber, and as an example of a preferred embodiment describes the use of the present invention in a wafer scrubbing system wherein both sides of the wafer are scrubbed.

The present invention includes a process for cleaning the brushes of a wafer scrubber. The present invention helps to alleviate and/or eliminate brush load-up, thus extending the useful lifetime of the brush. In a wafer scrubber the brushes are housed in a brush station. The wafers are loaded into the brush station one at time, scrubbed, and then transferred to the next station or step in the wafer scrubber. As the scrubbed wafer is being transferred out of the brush station, the next wafer to be scrubbed is loaded into the brush station. The scrubbing process is continuous so that throughput can be maximized. However, due to brush load up, the scrubbing process should be interrupted periodically so that the brushes may be cleaned. The brushes may be cleaned after a certain number of wafers have been scrubbed, or after the contamination level of the scrubbed wafer no longer meets the desired manufacturing requirements. It may also be desirable to clean the brushes after a specified time period or when the wafer scrubber is sitting idle.

Figure 1:
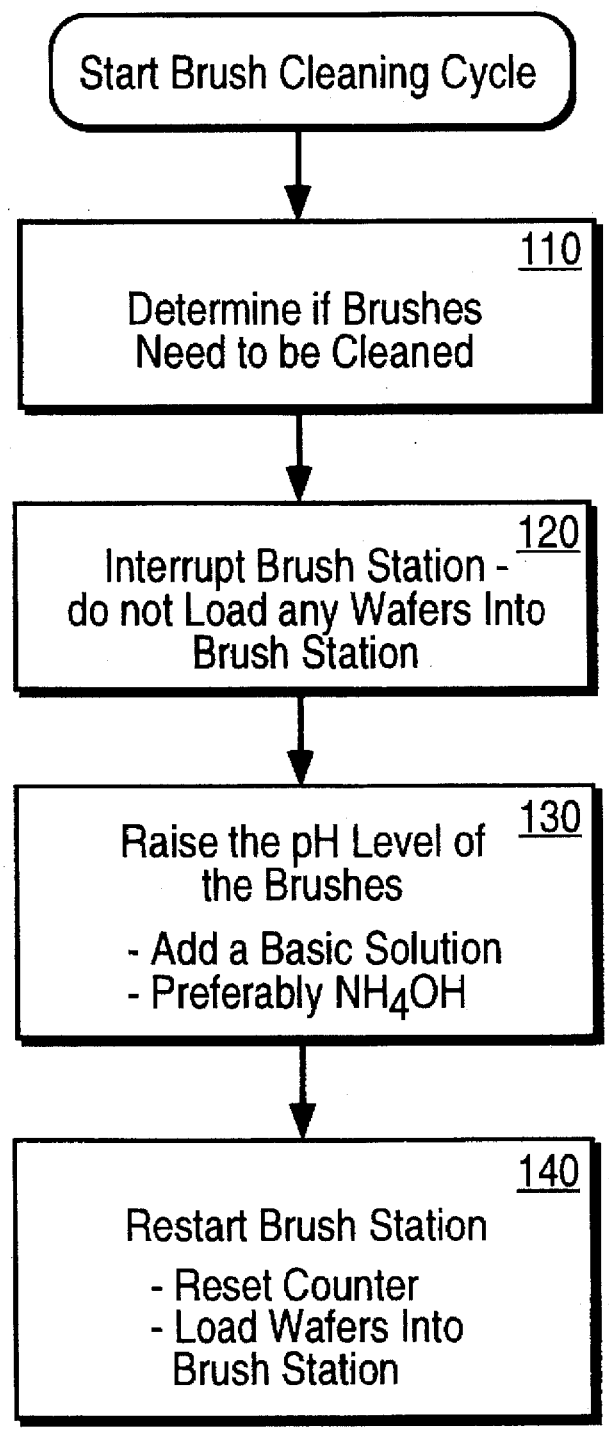
FIG. 1 illustrates a flow chart of a preferred embodiment of the present invention.

FIG. 1 illustrates a flow chart of a preferred embodiment of the present invention. At step 110, the determination must be made whether or not the brushes need cleaning. This determination can be made in any number of ways; for example, the manufacturer may decide to clean the brushes after a specific number of wafers have been cleaned, or after predetermined operating time has elapsed, or when the cleaned wafers exhibit a higher contamination level than desired, or when the scrubber is sitting idle. If it has been determined that the brushes of the scrubber need to be cleaned, then at step 120, the brush station is interrupted.

During the interrupt of the brush station the scrubbed wafer is transferred to the next station in the wafer scrubber, but no additional wafers are loaded into the brush station. It should be noted that since no additional wafers are loaded into the brush station during the brush cleaning cycle, the stations of the scrubber upstream may essentially be put on hold, if the brush cleaning cycle is longer than the processing time of an upstream station. Depending upon the particular scrubber and the types of stations that are upstream of the brush station, the scrubber may hold the wafers in the stations until the brush cleaning cycle is completed. Alternatively, the scrubber may stop any additional wafers from being unloaded from the wafer cassette entirely and then allow the last wafer unloaded from the cassette to proceed through all stations, including the scrub station being cleaned, prior to starting the brush cleaning cycle, so that the wafers will not be sitting in a station waiting for the brush cleaning cycle to end (i.e. the brush cleaning cycle is performed after the last wafer has exited the scrub station). Thus, the user may choose at what point/station upstream of the brush station that the scrubber should be stopped (or put on hold) during the brush cleaning cycle.

In order to clean the brushes, at step 130, the pH level of the brushes is raised. Prior to cleaning, the pH of the brushes is determined by the wafer scrubbing process. Typically scrubbing processes use acidic solutions (pH below 7.0) or neutral or slightly basic solutions. The pH level of the brushes can be raised by applying a basic solution to the brush. In a currently preferred embodiment, the pH level is raised to approximately 10 by applying an ammonium hydroxide ($NH_4OH$) solution, with a concentration in the range of approximately 0.5–2.0%, onto or through the brushes. The $NH_4OH$ solution may be applied to the brush in a number of ways, for example, spraying the solution onto the brush, dripping the solution onto the brush, or delivering the solution through the brush. The drip delivery system and the delivery system through the brush are described in copending applications titled "Drip Chemical Delivery Method and Apparatus," Ser. No. 08/275,785, filed on Jul. 15, 1994, and "Method and Apparatus for Chemical Delivery Through the Brush," serial number not yet assigned, filed on Oct. 13, 1995, both applications being assigned to the assignee herein. Additionally, in the above described currently preferred embodiment the basic solution is applied while rinsing the brush with water, for example, de-ionized water.

The basic solution changes the charge on the surface of the brushes such that the brushes have the same charge as the contaminants. Thus, the basic solution sets up a negative-to-negative zeta potential between the brushes and the contaminants. The brushes repel the contaminants (like charges repel) and the contaminants are then rinsed away.

The brushes are cleaned for a predetermined amount of time, i.e. the "treatment time," which is set by the scrubber operator. The treatment time is set such that the brushes will have sufficient time to be cleaned, but also such that the throughput of the wafer scrubber is not significantly decreased. In one currently preferred embodiment the treatment time is set such that the throughput of the system is not decreased by more than 10%. After the brushes have been cleaned, at step 140, the counter on the brush station is reset, the brush station is restarted, and wafers are again loaded into the brush station for cleaning.

Figure 2:
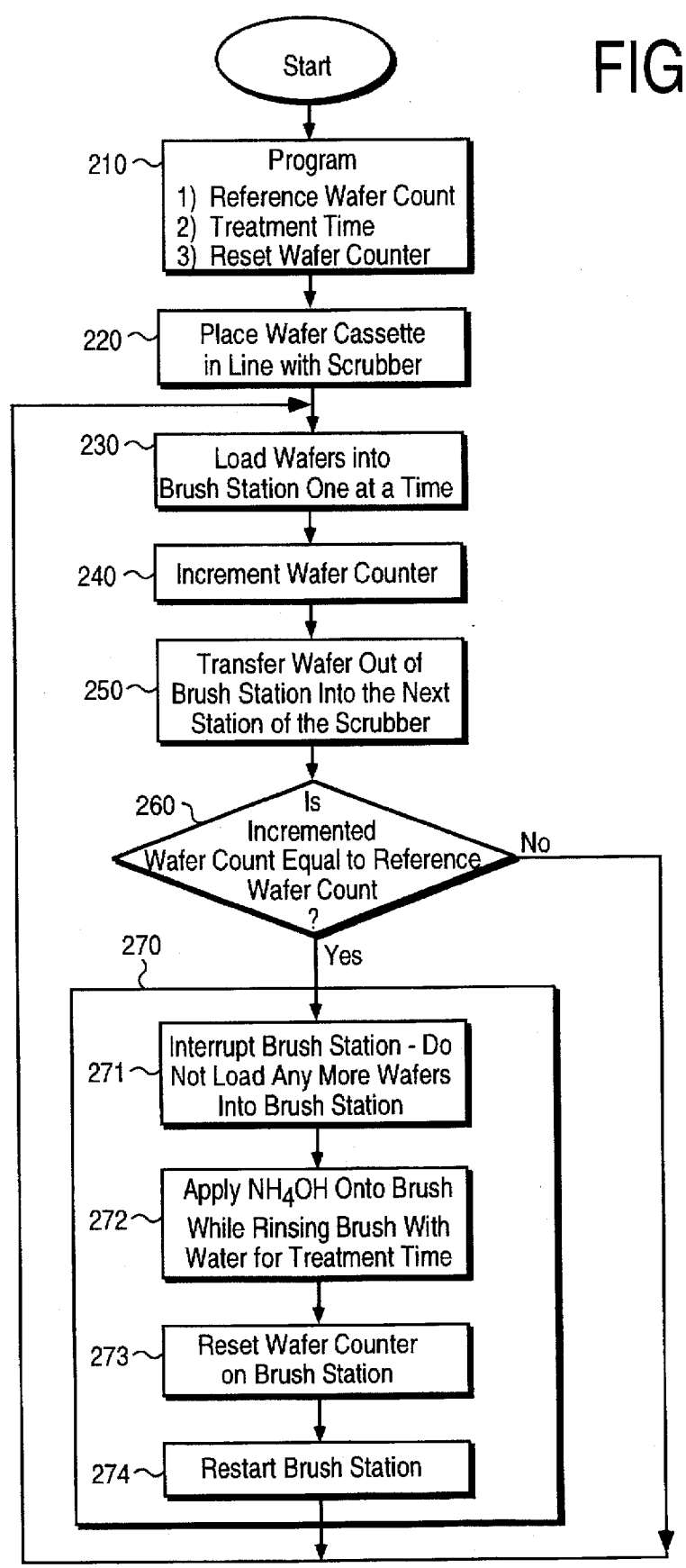
FIG. 2 illustrates a flow chart of a preferred embodiment of the present invention in a wafer scrubbing system.

FIG. 2 illustrates a flow chart of a preferred embodiment of the present invention in a wafer scrubbing system, where a reference wafer count is used to determine when to clean the brushes. At step 210, the wafer scrubber system is programmed with the user's desired reference wafer count and treatment time. The wafer counter on the brush station is also reset to zero at step 210.

A wafer cassette loaded with wafers is placed in line with the wafer scrubber at step 220. At step 230, the wafers are taken from the wafer cassette and loaded into the wafer scrubber, one at a time, in order to be cleaned. Depending upon the type of wafer scrubber the wafer may be cleaned first in a brush station or may undergo another process in another station before being scrubbed in a brush station. Either way, when the wafer is transferred into the brush station, at step 240, the wafer counter at that brush station is incremented by one (i.e. the wafer counter for the brush station is incremented by one each time a wafer is scrubbed in that brush station). In a currently preferred embodiment, the wafer is loaded directly into the brush station from the wafer cassette.

In a preferred embodiment, after the wafer is scrubbed the wafer is transferred out of the brush station and into the next station of the scrubber at step 250. The number of wafers counted by the brush station wafer counter (counter) is then compared to the reference wafer count at step 260. If the number of wafers counted and the reference wafer count are not equal then the brush station goes back to 230. If equal, then the brush station moves on and performs brush cleaning cycle 270.

At step 270 the brush cleaning cycle begins. The brush station is interrupted at step 271, and no additional wafers are loaded into the brush station. At step 272 (of cycle 270) the brushes are cleaned by applying a basic solution to the brushes, thus raising the pH level of the brushes. In a currently preferred embodiment the pH level is raised to approximately 10 by applying an ammonium hydroxide ($NH_4OH$) solution, with a concentration in the range of approximately 0.5–2.0%, to the brushes. The basic solution is applied to the brushes for the treatment time, which was programmed by the user in step 210. Additionally, in the above described currently preferred embodiment the basic solution is applied while rinsing the brushes with water, for example, de-ionized water. After the brushes have been cleaned, i.e. after the treatment time, the counter of the brush station is reset at step 273, and then at step 274 the brush station is restarted. For example, the brush station may be restarted by rinsing the brushes with de-ionized water to remove any cleaning solution, and then applying appropriate solutions for the wafer scrub process to the brushes. After the brush station is restarted, at step 274, the brush station then goes back to step 230 and wafers are again loaded into the brush station to be scrubbed.

Figure 3:
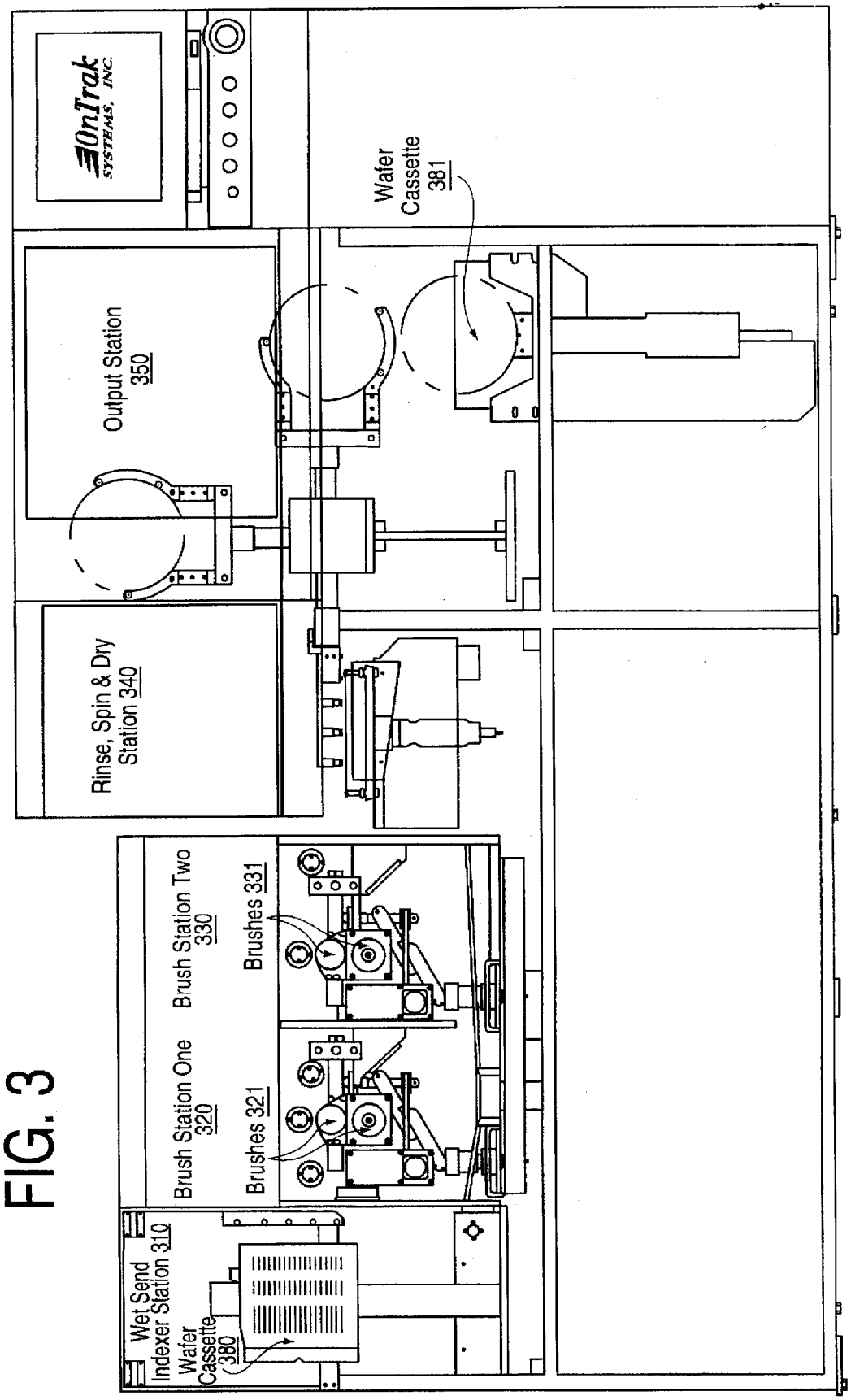
FIG. 3 illustrates a cross sectional view of a wafer scrubbing system.

FIG. 3 illustrates a cross sectional view of a wafer scrubbing system (scrubber) in particular the DSS-200™Scrubber, available from OnTrak Systems Incorporated, Milpitas, Calif. Wafer cassette 380 is placed in line with the scrubber by putting it into the Wet Send Indexer Station 310. Wafers are removed, one at a time, from wafer cassette 380 and loaded into brush station one 320. In brush station one 320, the wafer is scrubbed by brushes 321. Once the wafer is scrubbed, it is transported into brush station two 330, and a new wafer is loaded into brush station one 320.

The wafer which was transported to brush station two 330 is then scrubbed a second time by brushes 331. After being scrubbed in brush station two 330, the wafer is then transported on to rinse, spin, & dry station 340 where the wafer is rinsed, spun, and dried. Once the wafer is dried, it is transported on to output station 350 where the wafer is placed into wafer cassette 381. When wafer cassette 381 is full, the wafers may be removed or transferred for further processing or storage.

Figure 4A:
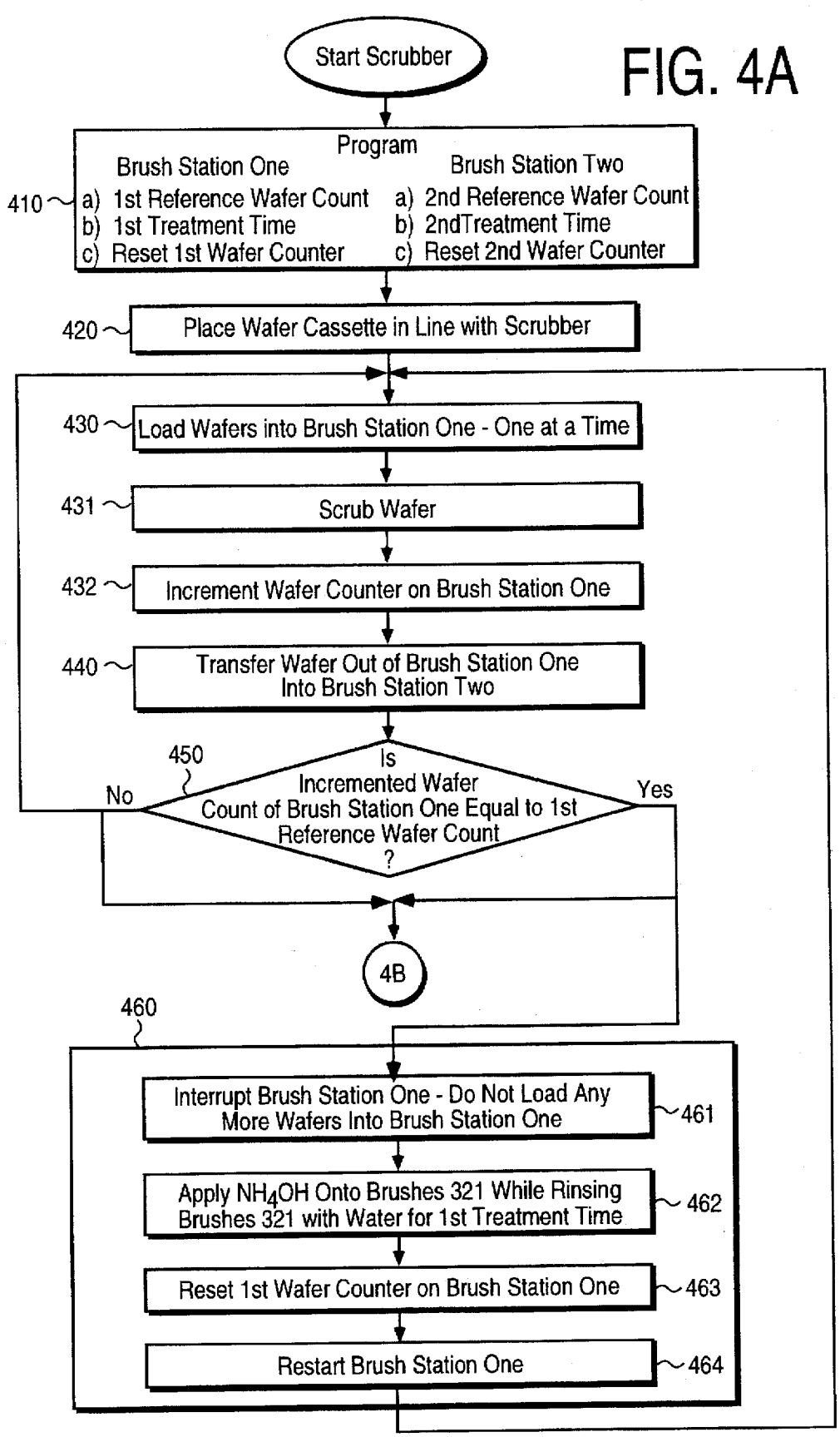
FIGS. 4A and 4B illustrate a flow chart of a preferred embodiment of the present invention as used in the wafer scrubbing system shown in FIG. 3.
Figure 4B:
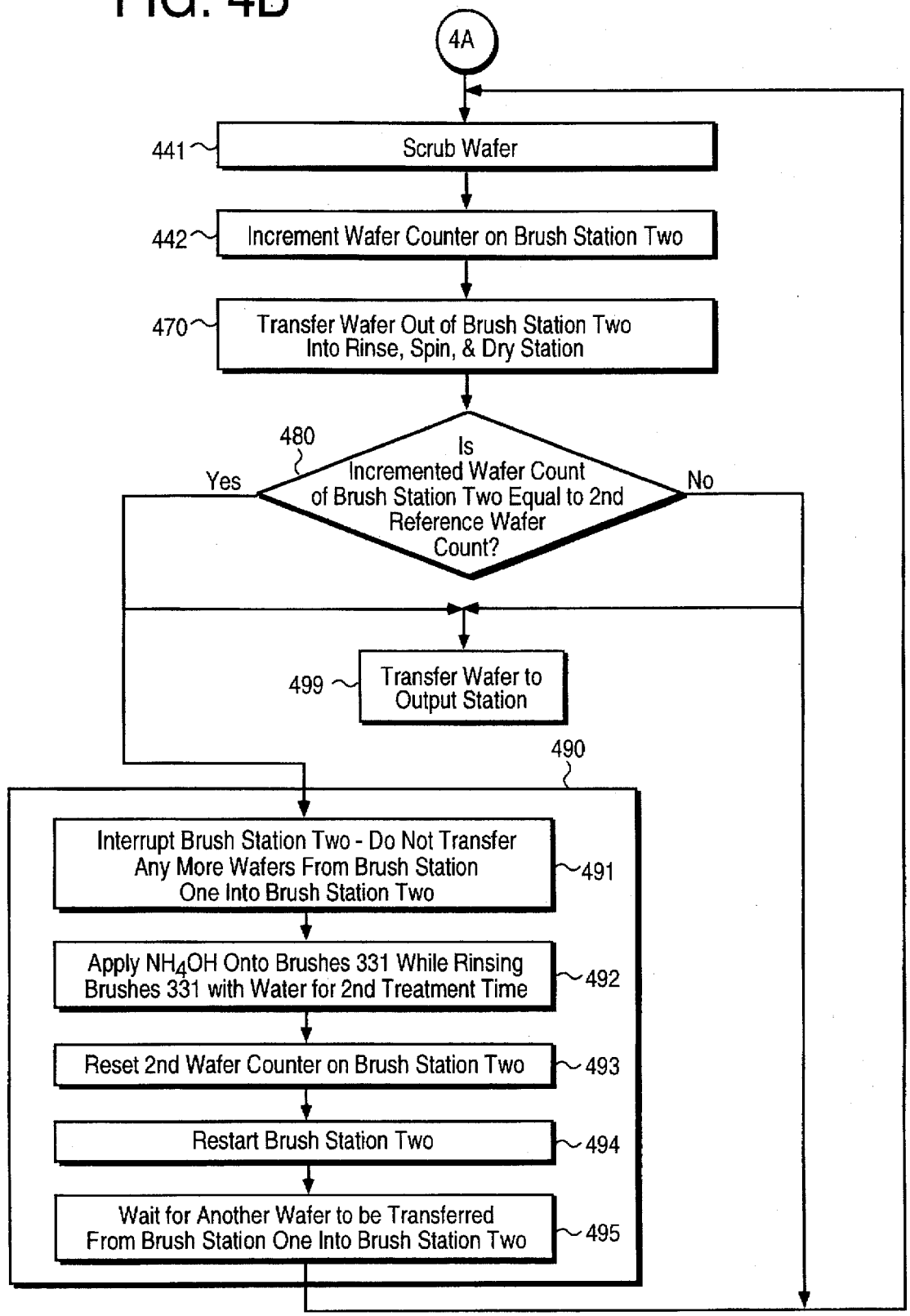

FIGS. 4A and 4B illustrate a flow chart of a preferred embodiment of the present invention as used in a scrubber with two brush stations, in particular the DSS-200™Scrubber shown in FIG. 3. Because in this preferred embodiment the two brush stations may be operated independently, at step 410, the scrubber is programmed with a first reference wafer count, a second reference wafer count, a first treatment time, and a second treatment time. Also at step 410, the counters on each brush station are reset to zero.

The first reference wafer count and the first treatment time correspond to brush station one 320, and the second reference wafer count and the second treatment time correspond to brush station two 330. It should be noted that the first reference wafer count and the second reference wafer count may be the same, such that the brushes 321 in brush station one 320 and the brushes 331 in brush station two 330 are cleaned after processing the same number of wafers, or the reference wafer counts may be different, such that the brushes in either brush station are cleaned more or less often than in the other.

At step 420, a wafer cassette 380, loaded with wafers ready to be cleaned is placed in line with the scrubber (i.e., the wafer cassette 380 is placed into Wet Send Indexer Station 310). Wafers are taken from the wafer cassette, at step 430, and loaded one at a time into brush station one 420. In brush station one 320 the wafer is scrubbed and at step 431. After the wafer is scrubbed, the counter at brush station one 320 is incremented by one at step 432, and the wafer is transferred out of brush station one 320 and into brush station two 330 at step 440. Once the wafer is transferred to brush station two 330, the number of wafers counted by brush station one 320 is compared to the first reference wafer count, at step 450. If the number of wafers counted by brush station one is not equal to the first reference wafer count, then brush station one 320 goes back to step 430 and another wafer is loaded into brush station one 320 to be scrubbed. However, if the number of wafers counted by brush station one 320 is equal to the first reference wafer count, then brush station one 320 performs brush cleaning cycle 460.

At step 460 the brush cleaning cycle, as previously described in the discussion of FIG. 1, is performed in brush station one 320. At step 461, brush station one is interrupted and no additional wafers are loaded into brush station one. At step 462, the brushes 321 are cleaned by applying a basic solution to the brushes, thus raising the pH level of the brushes. In a currently preferred embodiment the pH level is raised to approximately 10 by applying an ammonium hydroxide ($NH_4OH$) solution, with a concentration in the range of approximately 0.5–2.0% to brushes 321. The basic solution is applied to the brushes for the first treatment time, which was programmed by the user in step 410. Additionally, in the above described currently preferred embodiment the basic solution is applied while rinsing brushes 321 with water, for example, deionized water. After the brushes have been cleaned, i.e. after the first treatment time, the first wafer counter is reset to zero at step 463 and then at step 464 brush station one is restarted. After brush station one is restarted, at step 464, brush station one then goes back to step 430 and wafers are again loaded into brush station one to be scrubbed.

Once the wafer has been scrubbed in brush station one and is transferred on to brush station two, at step 440, the wafer is scrubbed a second time in brush station two 330, at step 441. It should be noted and it will be obvious to one with ordinary skill in the art, that once the wafer is transferred on to brush station two (or any of the respective stations that the wafer is transferred to), the wafer continues to be processed at the same time that the scrubber is performing other processes with respect to the other stations in the scrubber. For example, while the wafer is being scrubbed in brush station two 330, the scrubbing system may be performing brushing cleaning cycle 460 with respect to brush station one 320.

After the wafer is scrubbed in brush station two 330, the counter at brush station two is incremented by one and the wafer is transferred out of brush station two 330 and into rinse, spin and dry station 340, at step 470. After the wafer is transferred, the number of wafers counted by brush station two 330 is compared to the second reference wafer count, at step 480.

If the number of wafers counted by brush station two is not equal to the second reference wafer count, then brush station two 330 goes back to step 440, where another wafer is transferred into brush station two. However, if the number of wafers counted by brush station two 330 is equal to the second reference wafer court then brush station two 330 performs brush cleaning cycle 490.

At step 490, the brush cleaning cycle as previously described in the discussion of FIG. 1, is performed in brush station two 330. At step 491, the brush station two 330 is interrupted and no additional wafers are transferred from brush station one 320 into brush station two 330. It should be noted that brush station one 320 holds the wafer it is currently scrubbing in a rinse cycle until brush station two 330 completes brush cleaning cycle 490.

The brushes 331 are cleaned by applying a basic solution to the brushes, thus raising the pH level of the brushes. In a currently preferred embodiment the pH level is raised to approximately 10 by applying an ammonium hydroxide ($NH_4OH$) solution, with a concentration in the range of approximately 0.5–2.0%, to brushes 331. The basic solution is applied to the brushes for the second treatment time, which was programmed by the user in step 410.

Additionally, in the above described currently preferred embodiment the basic solution is applied while rinsing brushes 331 with water, for example, de-ionized water. After the brushes have been scrubbed, i.e. after the second treatment time, the second wafer counter is reset (step 493) and then at step 494 brush station two is restarted. After brush station two is restarted, at step 494, brush station two enters a waiting period at step 495 until another wafer is transferred from brush station one into brush station two. When a wafer is transferred into brush station two, then brush station two returns to step 440 of the scrubbing system.

Once the wafer has been scrubbed in brush station two and is transferred on to rinse, spin, & dry station 340 (step 470), where the wafer is rinsed, spun, and dried, then at step 499, the wafer is transferred to output station 350. In output station 350 the wafer is placed into wafer cassette 381. When wafer cassette 381 is full, the wafers may be removed or transferred for further processing or storage.

It will be appreciated that some of the steps described herein may be performed in a different order than as described. Additionally, some of the steps described herein may be omitted in some cases. It will also be appreciated that the present invention may be used on systems that do not use cassettes—for example, on systems that receive wafers one by one from another system or module. If desired, the brush cleaning cycle may be commenced in response to a signal from the other system or module. In general, the step of comparing the number of wafers cleaned to a reference count may be replaced by other comparisons or by determining whether a flag corresponding to a condition has been set or reset. As one example, wafer particle counts from outputted wafers may be fed into the system and used to set a flag when above a threshold, or may be compared directly to a threshold at the appropriate step. The brush cleaning cycle can be started when the particle count is above the threshold.

It should also be noted that in another preferred embodiment the cleaning cycle may be started when the scrubber sits in idle. For example, a scrubber may be in idle while waiting for more wafers to come from another process, while waiting for the cleaned wafers to be moved to storage, etc. If the brushes are cleaned during an idle then no additional time will be necessary to clean the brushes while the scrubber is scrubbing wafers and therefore the throughput of the scrubber is not decreased.

As an example the brush cleaning cycle, as described in FIG. 1, may be implemented when the scrubber, illustrated in FIG. 3, sits in idle. When a scrubber is not processing a wafer through the scrubber, the scrubber is usually idling and waiting for the operator to load additional wafers. In order to make efficient use of the scrubber idle time an operator can program the scrubber to perform the brush cleaning cycle. For example, an operator can program the scrubber at startup to run the brush cleaning cycle for 10 seconds (treatment time) if the scrubber has been sitting idle for 30 minutes (idle time) and run the brush cleaning cycle every 10 minutes (repeat time) thereafter until a wafer is once again processed through the system. Thus, in the above example if the scrubber remains idle for 30 minutes, the brush stations perform the brush cleaning cycle of FIG. 1 for 10 seconds and the brush stations will repeat the brush cleaning cycle every 10 minutes for 10 seconds until a wafer is processed through the scrubber. It should be noted that the operator may program each brush station independently such that brush station one may have a first idle time, a first treatment time, and a first repeat time, and brush station two may have a second idle time, a second treatment time, and a second repeat time, or both brush stations may be programmed to perform the brush cleaning cycle at the same idle time.

It will be obvious to one with skill in the art that the brush cleaning cycle may be performed after a predetermined number of wafers have been cleaned in a brush station, during idle time, or both. It should be noted that while a brush station is performing the brush cleaning cycle the other stations of the scrubber are still performing their functions and processing wafers. If another station of the scrubber is waiting to transfer a wafer into a brush station and that brush station is performing the brush cleaning cycle the wafer is held in the other station (usually in a rinse mode to keep the wafer wet) until the brush station completes the brush cleaning cycle, then the wafer is transferred.

It will be obvious to one with ordinary skill in the art that other alternative embodiments may also be used; for example, the brush cleaning cycle may be started after a preset amount of time has elapsed, or after a preset time has elapsed and a preset wafer count has been reached, or a preset time has elapsed or a preset wafer count has been reached, or any other alternative arrangement of "and/or" conditions may be used.

Thus, a process for brush cleaning has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method for brush cleaning comprising:
   providing a brush;
   scrubbing a wafer with said brush at a first pH level during substrate processing;
   removing said wafer;
   changing the pH level of said brush to remove particles from said brush, wherein said pH is raised to become less acidic by placing a basic solution onto said brush.

2. The process as described in claim 1 wherein said pH level is raised to approximately 10.

3. The process as described in claim 1 wherein said basic solution is placed onto said brush during a water rinse.

4. The process as described in claim 1 wherein said basic solution comprises an ammonium hydroxide solution.

5. The process as described in claim 4 wherein said ammonium hydroxide solution has a concentration in the range of approximately 0.5–2.0%.

6. A process for brush cleaning comprising:
   determining a reference number of wafers, wherein said reference number of wafers is the number of wafers to be cleaned in a wafer scrubber before cleaning said brush;
   setting a treatment time for a brush cleaning cycle;
   loading said wafer scrubber with wafers;
   counting a number of wafers being cleaned by said wafer scrubber, wherein a counter is used to count said number of wafers being cleaned by said wafer scrubber;
   interrupting said wafer scrubber after said number of wafers being cleaned by said wafer scrubber is equal to said reference number of wafers;
   starting said brush cleaning cycle, wherein a basic solution is applied to said brush to raise the pH level of said brush during said brush cleaning cycle;

resetting said counter;

stopping said brush cleaning cycle; and reloading said wafer scrubber with wafers.

7. The process as described in claim 6 wherein said reference number of wafers is the number of wafers that can be held in a wafer cassette.

8. The process as described in claim 6 where in said wafers are loaded into said wafer scrubber one at a time.

9. The process as described in claim 6 wherein said step of interrupting said wafer scrubber comprises:

stopping the loading of any more wafers into said wafer scrubber until said brush cleaning cycle has been completed.

10. The process as described in claim 6 wherein said pH level is raised to approximately 10.

11. The process as described in claim 6 wherein said basic solution comprises an ammonium hydroxide solution.

12. The process as described in claim 11 wherein the concentration of said ammonium hydroxide solution is in the range of approximately 0.5–2.0%.

13. The process as described in claim 6 wherein said basic solution is placed onto said brush during a water rinse.

14. The process as described in claim 6 wherein said treatment time is the amount of time that said brush cleaning cycle will last.

15. A process for cleaning the brushes in a wafer scrubber comprising:

programming a first brush station with a first treatment time and a first reference wafer count;

programming a second brush station with a second treatment time and a second reference wafer count;

placing a wafer cassette in line with said wafer scrubber;

loading wafers from said wafer cassette into said wafer scrubber;

counting a first counted number of wafers being cleaned in said first brush station using a first counter;

counting a second counted number of wafers being cleaned in said second brush station using a second counter;

determining if said first counted number of wafers is equal to said first wafer count, wherein if said first counted number of wafers is equal to said first wafer count then said first brush station is interrupted and a first brush cleaning cycle is performed by applying a basic solution to a brush in said first brush station in order to raise the pH level of said brush, wherein said first brush cleaning cycle takes place for a period equal to said first treatment time;

determining if said second counted number of wafers is equal to said second wafer count, wherein if said second counted number of wafers is equal to said second wafer count then said second brush station is interrupted and a second brush cleaning cycle is performed by applying a basic solution to a brush in said second brush station in order to raise the pH level of said brush, wherein said second brush cleaning Cycle takes place for a period equal to said second treatment time.

16. The process as described in claim 15 wherein said first reference wafer count is the number of wafers that are held in said wafer cassette.

17. The process as described in claim 15 wherein said second reference wafer count is the number of wafers are that held in said wafer cassette.

18. The process as described in claim 15 where in said wafers are loaded into said wafer scrubber one at a time.

19. The process as described in claim 15 wherein said first brush cleaning cycle comprises:

interrupting said first brush station;

applying a basic solution to said brush in said first brush station to raise the pH level of said brush;

resetting said first counter;

restarting said first brush station.

20. The process as described in claim 19 wherein said pH level is raised to approximately 10.

21. The process as described in claim 19 wherein said basic solution comprises an ammonium hydroxide solution.

22. The process as described in claim 21 wherein the concentration of said ammonium hydroxide solution is in the range of approximately 0.5–2.0%.

23. The process as described in claim 19 wherein said basic solution is placed onto said brush during a water rinse.

24. The process as described in claim 15 wherein said second brush cleaning cycle comprises:

interrupting said second brush station;

applying a basic solution to said brush in said second brush station to raise the pH level of said brush;

resetting said second counter;

restarting said second brush station.

25. The process as described in claim 24 wherein said pH level is raised to approximately 10.

26. The process as described in claim 24 wherein said basic solution comprises an ammonium hydroxide solution.

27. The process as described in claim 26 wherein the concentration of said ammonium hydroxide solution is in the range of approximately 0.5–2.0%.

28. The process as described in claim 24 wherein said basic solution is placed onto said brush during a water rinse.

29. A process for cleaning the brushes in a wafer scrubber comprising:

programming said wafer scrubber with an idle time and a treatment time;

determining if said scrubber has remained idle for said idle time, wherein if said wafer scrubber sits idle for said idle time a brush cleaning cycle is performed by applying a basic solution to a brush in said wafer scrubber in order to raise the pH level of said brush, wherein said brush cleaning cycle takes place for a period equal to said treatment time.

30. The process as described in claim 29 wherein said pH level is raised to approximately 10.

31. The process as described in claim 29 wherein said basic solution comprises an ammonium hydroxide solution.

32. The process as described in claim 31 wherein the concentration of said ammonium hydroxide solution is in the range of approximately 0.5–2.0%.

33. The process as described in claim 29 wherein said basic solution is placed onto said brush during a water rinse.

34. The process as described in claim 29 wherein said treatment time is the amount of time that said brush cleaning cycle will last.

35. The process as described in claim 29 further comprising the steps of:

programming said wafer scrubber with a repeat time;

determining if said scrubber remains in idle after a period equal to said repeat time has passed since said brush cleaning cycle was last performed, wherein said brush cleaning cycle is repeated each time said scrubber continues to remain idle for a period equal to said repeat time.

36. The process for cleaning the brushes in a wafer scrubber comprising:

programming a first brush station with a first treatment time and a first reference wafer count;

programming a second brush station with a second treatment time and a second reference wafer count;

programming said scrubber with an idle time, a third treatment time, and a repeat time;

placing a wafer cassette in line with said wafer scrubber;

loading wafers from said wafer cassette into said wafer scrubber;

counting a first counted number of wafers being cleaned in said first brush station using a first counter;

counting a second counted number of wafers being cleaned in said second brush station using a second counter;

determining if said first counted number of wafers is equal to said first wafer count, wherein if said first counted number of wafers is equal to said first wafer count then said first brush station is interrupted and a first brush cleaning cycle is performed by applying a basic solution to a brush in said first brush station in order to raise the pH level of said brush, wherein said first brush cleaning cycle takes place for a period equal to said first treatment time;

determining if said second counted number of wafers is equal to said second wafer count, wherein if said second counted number of wafers is equal to said second wafer count then said second brush station is interrupted and a second brush cleaning cycle is performed by applying a basic solution to a brush in said second brush station in order to raise the pH level of said brush, wherein said second brush cleaning cycle takes place for a period equal to said second treatment time; and determining if said scrubber has remained idle for said idle time, wherein if said wafer scrubber sits idle for said idle time a third brush cleaning cycle is performed by applying a basic solution to a brush in said scrubber in order to raise the pH level of said brush, wherein said third brush cleaning cycle takes place for a period equal to said third treatment time and wherein if said wafer scrubber remains in idle after a period equal to said repeat time has passed since said third brush cleaning cycle was last performed, wherein said third brush cleaning cycle is repeated each time said scrubber continues to remain idle for a period equal to said repeat time.

37. The process as described in claim 36 wherein said wafers are loaded into said wafer scrubber one at a time.

38. The process as described in claim 36 wherein said first brush cleaning cycle comprises:

interrupting said first brush station;

applying a basic solution to said brush first brush station to raise the pH level of said brush;

resetting said first counter;

restarting said first brush station.

39. The process as described in claim 38 wherein said pH level is raised to approximately 10.

40. The process as described in claim 38 wherein said basic solution comprises an ammonium hydroxide solution.

41. The process as described in claim 40 wherein the concentration of said ammonium hydroxide solution is in the range of approximately 0.5–2.0%.

42. The process as described in claim 38 wherein said basic solution is placed onto said brush during a water rinse.

43. The process as described in claim 36 wherein said second brush cleaning cycle comprises:

interrupting said second brush station;

applying a basic solution to said brush in said second brush station to raise the pH level of said brush;

resetting said second counter;

restarting said second brush station.

44. The process as described in claim 43 wherein said pH level is raised to approximately 10.

45. The process as described in claim 43 wherein said basic solution comprises an ammonium hydroxide solution.

46. The process as described in claim 45 wherein the concentration of said ammonium hydroxide solution is in the range of approximately 0.5–2.0%.

47. The process as described in claim 43 wherein said basic solution is placed onto said brush during a water rinse.

48. The process as described in claim 36 wherein said third brush cleaning cycle comprises:

interrupting said first and second brush stations;

applying a basic solution to said brushes of said first and second brush stations to raise the pH level of said brushes; and restarting said first and second brush stations.

49. The process as described in claim 48 wherein said pH level is raised to approximately 10.

50. The process as described in claim 48 wherein said basic solution comprises an ammonium hydroxide solution.

51. The process as described in claim 50 wherein the concentration of said ammonium hydroxide solution is in the range of approximately 0.5–2.0%.

52. The process as described in claim 50 wherein said basic solution is placed onto said brush during a water rinse.

* * * * *